(12) United States Patent
Nistler et al.

(10) Patent No.: US 7,626,392 B2
(45) Date of Patent: Dec. 1, 2009

(54) ANTENNA UNIT FOR A PET/MRI SCANNER

(75) Inventors: Jürgen Nistler, Erlangen (DE);
Wolfgang Renz, Erlangen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/222,777

(22) Filed: Aug. 15, 2008

(65) Prior Publication Data

US 2009/0051362 A1    Feb. 26, 2009

(30) Foreign Application Priority Data

Aug. 24, 2007  (DE)  ........................ 10 2007 040 112

(51) Int. Cl.
*G01V 3/00* (2006.01)
(52) U.S. Cl. ...................................... 324/318
(58) Field of Classification Search ......... 324/300–322; 600/410–435
See application file for complete search history.

(56) References Cited

U.S. PATENT DOCUMENTS

2007/0055127 A1    3/2007  Ladebeck et al.

FOREIGN PATENT DOCUMENTS

DE    10 2005 040 107    5/2007

*Primary Examiner*—Brij B. Shrivastav
*Assistant Examiner*—Dixomara Vargas
(74) *Attorney, Agent, or Firm*—Harness, Dickey & Pierce, P.L.C.

(57) ABSTRACT

An antenna unit for a PET/MRI scanner is disclosed, including a supporting tube in which at least one antenna for MR signals is arranged. In at least one embodiment, the supporting tube has at least one permeable section and one impermeable section, the permeable section of which has a greater permeability to PET quanta than the impermeable section. The antenna unit further includes a screen for radio-frequency signals which is arranged outside of the supporting tube and surrounds the latter. In at least one embodiment, an intermediate layer is arranged between the supporting tube and the screen and, in the region of the permeable section of the supporting tube, is composed of, at least in part, a material which has a permeability to PET quanta comparable to the permeable section.

16 Claims, 2 Drawing Sheets

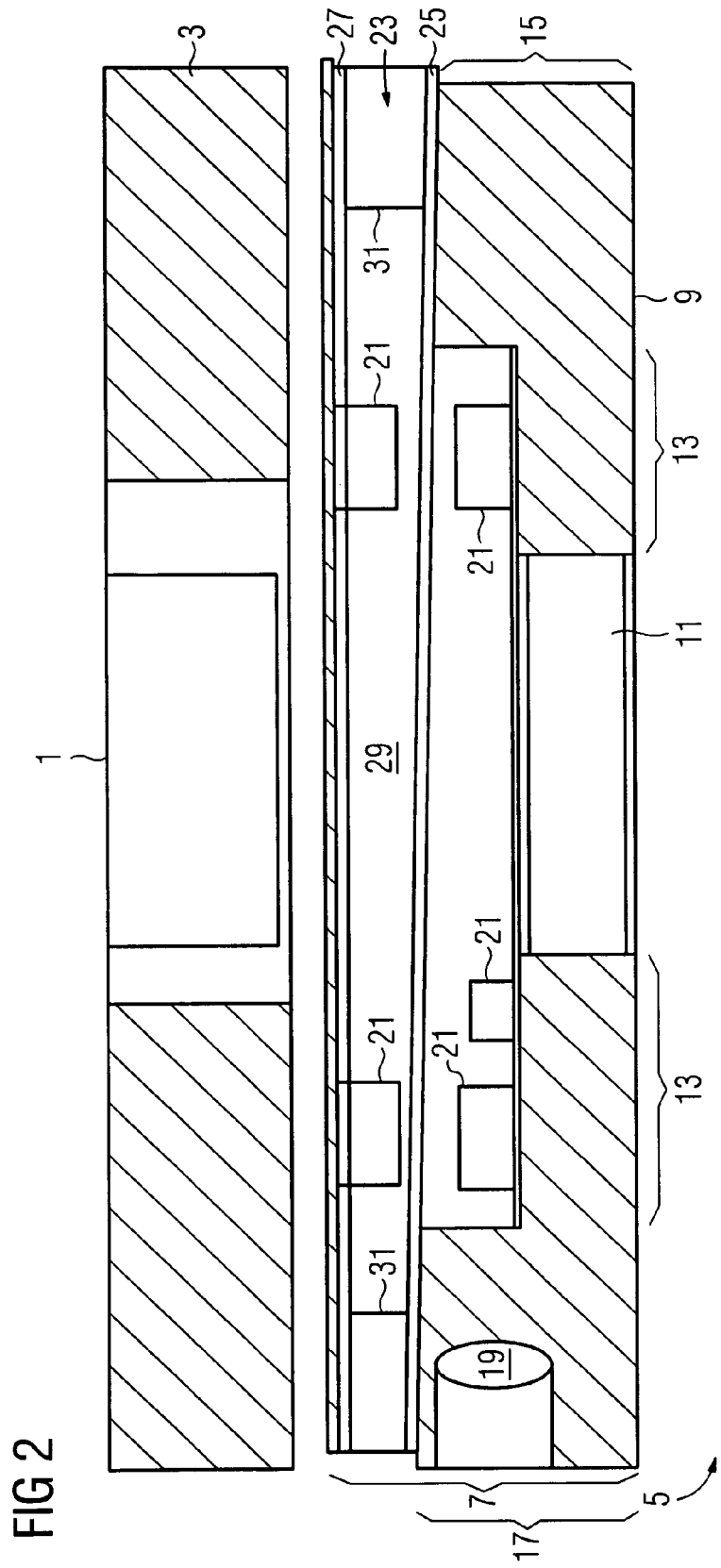

ANTENNA UNIT FOR A PET/MRI SCANNER

PRIORITY STATEMENT

The present application hereby claims priority under 35 U.S.C. §119 on German patent application number DE 10 2007 040 112.6 filed Aug. 24, 2007, the entire contents of which is hereby incorporated herein by reference.

FIELD

Embodiments of the present invention generally relate to an antenna unit for a PET/MRI scanner. For example, embodiments may relate to an antenna unit comprising a supporting tube in which at least one antenna for MR signals is arranged, wherein the supporting tube has at least one permeable section and one impermeable section, the permeable section of which has a greater permeability to PET quanta than the impermeable section; further comprising a screen for radio-frequency signals which is arranged outside of the supporting tube and surrounds the latter.

BACKGROUND

It is a requirement of combined PET/MRI scanners to arrange the units required for recording the MRI and PET data within the MR magnet and the MR gradient coil. In this case, it is a requirement to design the RF sending/receiving system for MR signals, and the PET detector so that they are as small and as integrated as possible so that the opening of the PET/MRI scanner can be chosen to be as large as possible and the greatest amount of space is provided for the patient to be examined. The RF sending/receiving system is arranged around the patient opening in the proximity of the patient so that both the RF radiation can be radiated into the patient to excite the magnetic resonance, and the resulting magnetic resonance signals can be detected by the receiving system. In the region of the PET detector lying further outside, it is a requirement to design the RF sending/receiving system to be as permeable as possible to PET radiation. After its creation in the body of the patient, PET radiation is absorbed or scattered on its path to the PET detector when traversing solid matter and the tissue of the patient. These processes lead to an attenuation of the PET radiation, which adversely affects the capability of the system.

It is necessary to provide a surrounding radio-frequency screen around the RF sending/receiving system, so that as little radiation as possible is emitted by the sending/receiving system. The radio-frequency screen includes, for example, circuit boards which are laminated with copper on one side or on both sides, the copper layers having thicknesses in the range of 9 to 18 µm and being provided with slots to suppress turbulent gradient flows. The radio-frequency screen must in this case be fixed to a robust load-bearing structure, so that a defined relative position in relation to the RF antenna can be maintained and the generation of noise is avoided. In known solutions, the structure is generally composed of solid glass-reinforced plastic (GRP) or a comparable material. However, these are not optimum materials due to the excessively strong damping of the PET radiation.

SUMMARY

In at least one embodiment of the present invention, an antenna unit is specified for a PET/MRI scanner which has sufficiently low damping of PET radiation.

In at least one embodiment, the antenna unit includes a supporting tube in which an antenna for MR signals is arranged. The supporting tube has a section permeable to PET quanta, through which PET quanta from the patient can reach the above-lying PET detector arranged outside of the antenna unit in a relatively unimpeded manner. Furthermore, the antenna unit has a screen for radio-frequency signals, which is arranged outside of the supporting tube and surrounds the latter. An intermediate layer is arranged between the supporting tube and the screen and, in the region of the permeable section of the supporting tube, is composed of, at least in part, a material which has a permeability to PET quanta comparable to the permeable section. By inserting the intermediate layer it is possible to provide a sufficiently stable structure to stabilize the radio-frequency screen; this is not possible on the supporting tube due to the permeable section.

In an advantageous embodiment of the invention, the intermediate layer is of multi-layered design and the permeable material is arranged between two load-bearing layers. One layer of the two load-bearing layers is in contact with the supporting tube and the other is in contact with the screen. The load-bearing layers provide increased stability of the intermediate layer for the RF screen.

In one advantageous refinement of an embodiment of the invention, the intermediate layer includes at least one stiffening ring which radially surrounds the supporting tube. This stiffening ring is preferably arranged outside of the permeable region of the supporting tube and the permeable material, and further stabilizes the structure.

In a further advantageous refinement, the intermediate layer and the supporting tube in each case have in the longitudinal direction a contact surface which has a conical profile toward the other one. Accordingly, the inner side of the intermediate layer is, for example, constructed with a decreasing inner radius along the longitudinal direction, while the outer radius of the supporting tube—matching this—is likewise designed such that it decreases in the longitudinal direction. It follows that the contact surface between the supporting tube and the intermediate layer has a conical profile in the longitudinal direction of the antenna unit. As a result, it is possible to remove the supporting tube from the intermediate layer in order, for example, to be able to carry out separate servicing for both units. The conically tapering contact surface permits simple removal and reinsertion of the supporting tube from and into the intermediate layer. The radio-frequency screen can remain on the cylindrical outer side of the intermediate layer during this servicing.

BRIEF DESCRIPTION OF THE DRAWINGS

Further advantages and refinements of the invention emerge from the example embodiments described in the following text in conjunction with the figures, in which:

FIG. 2 shows a schematic illustration of an example embodiment of the antenna unit.

DETAILED DESCRIPTION OF THE EXAMPLE EMBODIMENTS

Figure 1:
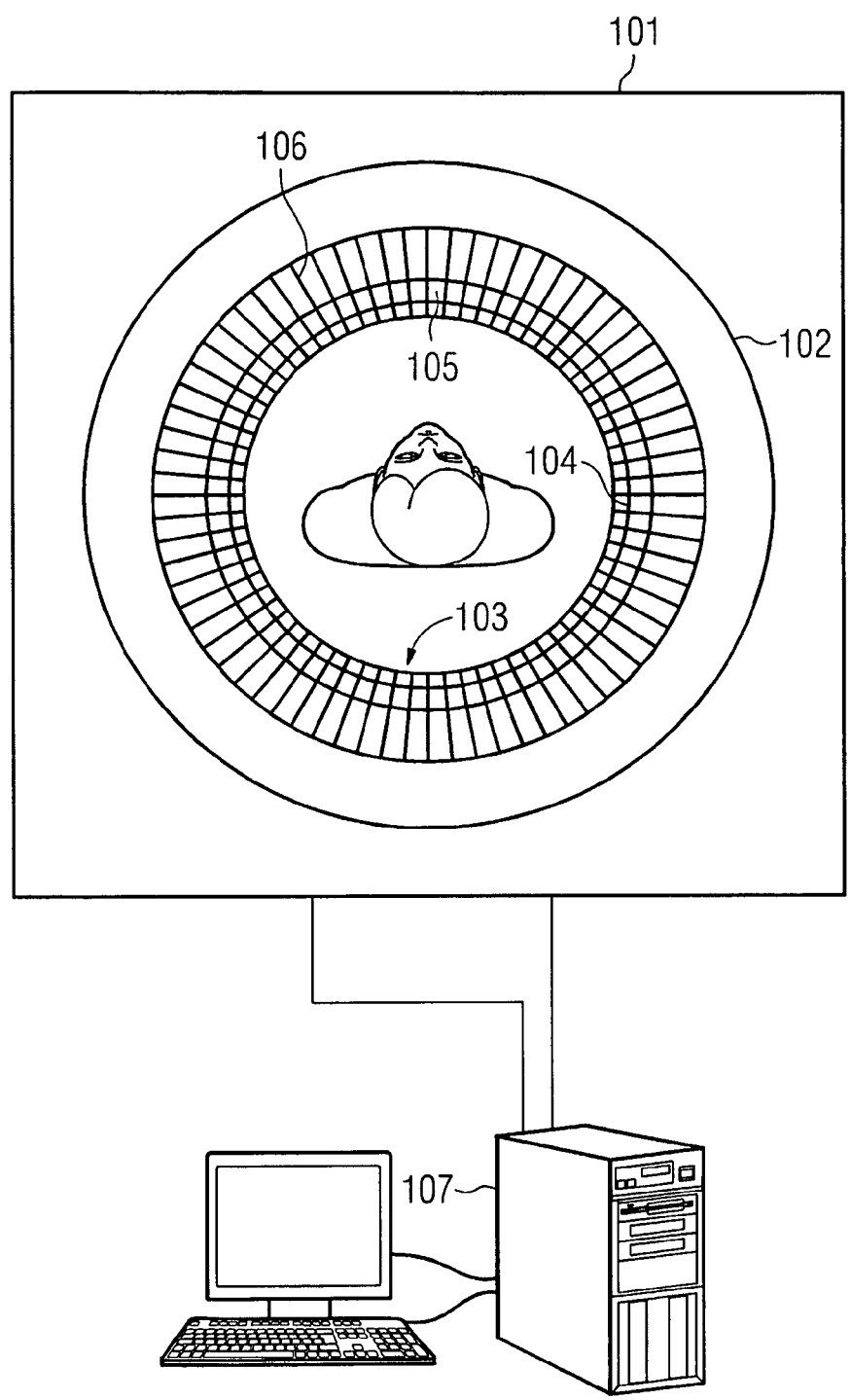
FIG. 1 shows a schematic illustration of a combined PET/MRI scanner.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The example embodiments of the invention can preferably be used in a combined PET/MRI scanner. A combined machine has the advantage that both MRI and PET data can be acquired isocentrically. This makes it possible to precisely define the examination volume within the region of interest using data from the first modality (PET) and to use this information in the further modality (e.g. magnetic resonance). Transfer of the volume information of the region of interest from an external PET scanner to an MRI scanner is indeed possible; however, registering the data is more complex.

In general, in the region of interest selected in the PET data record, all data which can be collected using magnetic resonance imaging or another imaging method can be determined. By way of example, instead of spectroscopy data, it is also possible to acquire fMRI data, diffusion charts, T1 or T2 weighted images, or quantitative parameter charts by means of magnetic resonance examinations of the region of interest. Likewise, it is possible to use methods from computed tomography (e.g. perfusion measurement, multi-energy imaging) or x-rays. In each case, it is advantageous in the described method that the region of interest can be restricted very precisely to a specifically present pathology of the patient by means of the PET data record.

However, in addition, it is also possible to display different biological characteristics in the PET data record by using a plurality of so-called tracers and further optimize the region of interest and the volume determined in this way, or to select a plurality of different examination volumes at the same time which are then analyzed in subsequent examinations.

FIG. 1 shows a known apparatus 101 for superposed MRI and PET imaging. The apparatus 101 comprises a known MRI tube 102.

The MRI tube 102 defines a longitudinal direction z, which extends orthogonally to the plane of the drawing of FIG. 1.

As is shown in FIG. 1, a plurality of PET detection units 103 arranged in mutually opposing pairs around the longitudinal direction z are arranged coaxially within the MRI tube 102. The PET detection units 103 preferably include an APD photodiode array 105 with an upstream array of LSO crystals 104 and an electrical amplifier circuit (AMP) 106. However, the invention is not limited to the PET detection units 103 with the APD photodiode array 105 and the upstream array of LSO crystals 104; rather, differently designed photodiodes, crystals and apparatuses can similarly also be used for detection.

The image processing for superposed MRI and PET imaging is carried out by a computer 107.

The MRI tube 102 defines a cylindrical first field of view along its longitudinal direction z. The multiplicity of PET detection units 103 defines a cylindrical second field of view along the longitudinal direction z. According to an embodiment of the invention, the second field of view of the PET detection units 103 substantially corresponds to the first field of view of the MRI tube 102. This is implemented by correspondingly adapting the arrangement density of the PET detection units 103 along the longitudinal direction z.

FIG. 2 illustrates an example embodiment of the invention in a cross-sectional view. A PET detector unit 1, which is constructed, for example, from LSO crystals, is arranged in the outer region. The PET detector unit 1 is held by a PET gantry 3, which simultaneously includes a gradient coil. Both the PET detector unit 1 and the PET gantry 3 are designed, perpendicular to the plane of the drawing, in a radially surrounding manner and surround a patient opening 5. An RF sending/receiving system 7 is arranged within the patient opening 5. It comprises a supporting tube 9 which, for example, is composed of GRP or another type of casting compound. As an alternative, it can be designed as a wrapped tube with a foam insert. A cover (not illustrated) is situated on the inner side of the supporting tube 9 after it has been installed in the PET/MRI scanner.

The supporting tube is formed from a plurality of parts and includes in its center a section 11 which is composed of a material permeable to PET radiation (e.g. Rohacell®). The permeable section 11 and an adjacent section 13 of the supporting tube 9 are designed with thinner walls than sections of the supporting tube 9 situated toward the outside. As a result, there is not enough mechanical stability to affix a radiofrequency screen on the outside of the supporting tube.

The radius of the supporting tube 9 increases linearly along its profile from a smaller radius on one side of the supporting tube 15 to another side 17 of the supporting tube and thus is conical. RF cables 19 run within the supporting tube and there are capacitors 21 belonging to the RF antenna in the region of the sections 13. An intermediate layer 23 is arranged outside of the supporting tube 9 and comprise's two load-bearing layers 25 and 27. These load-bearing layers 25 and 27 are composed of, for example, GRP with a thickness of 2 mm. The profile of the load-bearing layer 25 is matched radially in the longitudinal direction to the profile of the supporting tube 9. It follows that, like the supporting tube 9, it is likewise conical. Level with the region of the permeable material 11 of the supporting tube 9 there is within the intermediate layer 23, between the load-bearing layers 25 and 27, a foam material 29, which likewise has an increased permeability to PET quanta. Capacitors 21 can likewise be arranged within this layer.

Two stiffening rings 31 are arranged between the load-bearing layers 25 and 27 outside of the region permeable to PET and stabilize the two load-bearing layers 25 and 27 with respect to each other and likewise radially surround the supporting tube 9. The intermediate layer 23 is surrounded by a radio-frequency screen 33, which screens the entire antenna unit.

Due to the conical embodiment of the boundary surface between the supporting tube 9 and the intermediate layer 23, it is possible to remove the supporting tube 9 from the intermediate layer 23 in a simple manner. Servicing the capacitors 21 and the RF cables 19 is thus readily possible. Due to the stiffening rings 31 and the load-bearing layers 25 and 27, the intermediate layer is robust enough to be able to bear the radio-frequency screen, even without the supporting tube 9. Due to the conical form of the connection between the intermediate layer 23 and the supporting tube 9, a stiff connection is ensured, as is reproducible positioning of the radio-frequency screen 33. Furthermore, it is advantageous that mechanical deformations of the supporting tube 9 (for example, by inserting a patient couch into the patient opening 5) hardly affect the characteristics of the overall sending and receiving system due to the coupling of the radio-frequency screen 33 and the supporting tube 9. This is likewise advantageous in arrangements which are not PET compatible.

If a patient injected with a PET active radionuclide is located within the patient opening 5, when PET quanta are emitted, they will reach the detector without significant attenuation on the path from the patient to the PET detector 1, through the permeable section 11 of the supporting tube 9 and through the permeable foam material 29 of the intermediate layer. In the case of possible attenuation correction, these losses do not have to be taken into account. They are small compared to the losses caused by the patient's tissue.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An antenna unit for a PET/MRI scanner, comprising:
a supporting tube dimensioned to surround a patient opening, in which at least one antenna for MR signals is arranged, wherein the supporting tube includes at least one first and second sections, the at least one first section including a relatively greater permeability to PET quanta than the at least one second section;
a screen for radio-frequency signals, arranged outside of the supporting tube and surrounding the supporting tube; and
an intermediate layer, arranged between the supporting tube and the screen, wherein in the region near the at least one first section of the supporting tube, the intermediate layer is composed of, at least in part, a material which has a permeability to PET quanta comparable to the at least one first section.

2. The antenna unit as claimed in claim 1, wherein the intermediate layer is of multi-layered design and the permeable material is arranged between two load-bearing layers, wherein the one layer is in contact with the supporting tube and the other layer is in contact with the screen.

3. The antenna unit as claimed in claim 2, wherein the intermediate layer is designed in such a way that the supporting tube is removable therefrom.

4. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 2.

5. The antenna unit as claimed in claim 2, wherein at least one stiffening ring, radially surrounding the supporting tube, is arranged between the layers.

6. The antenna unit as claimed in claim 5, wherein the intermediate layer is designed in such a way that the supporting tube is removable therefrom.

7. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 5.

8. The antenna unit as claimed in claim 5, wherein the stiffening ring is arranged outside of the region of the permeable material.

9. The antenna unit as claimed in claim 8, wherein the intermediate layer is designed in such a way that the supporting tube is removable therefrom.

10. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 8.

11. The antenna unit as claimed in claim 1, wherein the intermediate layer is designed in such a way that the supporting tube is removable therefrom.

12. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 11.

13. The antenna unit as claimed in claim 1, wherein the intermediate layer and the supporting tube include a conically profiled contact surface in the longitudinal direction.

14. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 13.

15. An apparatus, comprising:
a combination of a magnetic resonance imaging scanner and a positron emission tomography scanner, in which an MRI RF sending/receiving system and a PET detector are arranged within a magnet and a gradient coil of the MRI scanner, the MRI RF sending/receiving system including an antenna unit as claimed in claim 1.

16. The antenna unit as claimed in claim 1, wherein the at least one first section is a permeable section and the at least one second section is an impermeable section.

* * * * *